(12) United States Patent
Wugoski

(10) Patent No.: US 6,690,392 B1
(45) Date of Patent: Feb. 10, 2004

(54) METHOD SYSTEM SOFTWARE AND SIGNAL FOR AUTOMATIC GENERATION OF MACRO COMMANDS

(75) Inventor: Theodore David Wugoski, Fort Worth, TX (US)

(73) Assignee: Gateway, Inc., Poway, CA (US)

( * ) Notice: Subject to any disclaimer, the term of this patent is extended or adjusted under 35 U.S.C. 154(b) by 0 days.

(21) Appl. No.: 09/353,911

(22) Filed: Jul. 15, 1999

(51) Int. Cl.[7] .................................................. G09G 5/00
(52) U.S. Cl. ........................ 345/744; 345/716; 345/704
(58) Field of Search ................................. 345/700, 704, 345/705, 716, 717, 744, 745, 762, 765, 771, 810, 825, 826, 835, 840, 970, 169, 172; 348/734, 563, 569

(56) References Cited

U.S. PATENT DOCUMENTS

| | | | | |
|---|---|---|---|---|
| 4,623,887 A | | 11/1986 | Welles, II ............... 340/825.57 |
| 5,070,534 A | * | 12/1991 | Lascelles et al. ............ 345/764 |
| 5,115,501 A | | 5/1992 | Kerr ................................ 707/9 |
| 5,410,326 A | * | 4/1995 | Goldstein .................... 348/734 |
| 5,689,663 A | * | 11/1997 | Williams ..................... 345/721 |
| 5,726,688 A | | 3/1998 | Siefert et al. ................ 345/821 |
| 6,127,941 A | * | 10/2000 | Van Ryzin ............. 340/825.69 |
| 6,208,341 B1 | * | 3/2001 | van Ee et al. ............... 345/716 |
| 6,211,870 B1 | * | 4/2001 | Foster ......................... 345/744 |
| 6,243,707 B1 | * | 6/2001 | Humpleman et al. ....... 707/102 |
| 6,346,934 B1 | * | 2/2002 | Wugofski .................... 345/158 |

* cited by examiner

*Primary Examiner*—Sy D. Luu
(74) *Attorney, Agent, or Firm*—Scott Charles Richardson; Richard P Gilly; Wolf Block Schorr Solls-Cohen LLP

(57) ABSTRACT

A method, signal, system, software, and user interface for selecting command sequences and saving the sequences as a macro. The invention includes sourcing input devices and graphical user interfaces for both input commands and referencing macro elements. Macro elements consist of macro keys such as hard keys and soft keys. The command sequence may be automatically detected, saved, and evaluated for both economy and threshold.

39 Claims, 6 Drawing Sheets

METHOD SYSTEM SOFTWARE AND SIGNAL FOR AUTOMATIC GENERATION OF MACRO COMMANDS

FIELD OF THE INVENTION

The present invention generally relates generally to commands and, more particularly, to macros used to perform commands

BACKGROUND OF THE INVENTION

On the forefront in the advancement of the home entertainment industry is the convergence of home entertainment components into one system. PCs, TVs, DVDs, CD players, EPGs (Electronic Program Guides), tuners, etc., are being integrated to form a single entertainment system, namely, convergence systems. However, as these components are integrated into one system, standardization of user interfaces among all components is progressively challenged.

Currently, users may employ a plurality of input devices to interface with convergence systems. For example, remote control devices typical of a television or VCR have been developed to be used with convergence systems. Additionally, user interfaces such as graphical user interfaces, are currently used to aid in assisting integration of components for convergence systems. For instance, a typical feature of both graphical user interfaces and remote control devices used in convergence systems is the ability to record command sequences and store them in a macro that is referenced by a macro element such as a macro key. A macro element or key allows a user to access a command sequence that is stored in the memory of the system as a macro. Typical macro elements are soft keys, such as icons, macro buttons, etc., accessible through a graphical user interface and hard keys, such as the buttons on a remote control device, keys on a keyboard, etc.

One example of a macro would be storing a sequence of commands such as opening a document, copying a portion of the text within the document, pasting the copied portion of text into another document, and saving the new document containing the pasted text. A user can create a macro to perform this sequence of functions and save the macro on the system where it may be accessed through a macro element such as a button or icon within the graphical user interface. Therefore, users can create multiple macros to increase efficiency and reduce mundane tasks.

As a further example, suppose a user wanted to create a macro using a universal remote control device for TVs, VCRs, stereos, etc. Current technology allows a user to select a sequence of commands using the remote control device and store the sequence of commands in a macro that is accessed by a macro key on the remote control device. For instance, a user may perform a sequence of commands to set up a VCR for recording a program that may include the steps of turning on the VCR, selecting a menu, and selecting a record function. Storing this sequence of events in a macro, and accessing the macro through the use of a macro key on the remote control device, simplifies the steps involved in programming a VCR which further allows a user to record programs more frequently due to the ease of programming.

Currently, convergence systems have the capability to autonomously record functions i.e. record macros using graphical user interfaces, record macros using remote control devices, etc., but these systems fall short of recording a sequence of commands initiated from any source within the convergence system. Further, current systems do not allow macros to be accessed from any usable macro element source (i.e., remote controls, devices, user interfaces, keyboards, etc.). For example, the user may wish to use a remote control device to create the VCR recording macro and macro button mentioned above, but would further want to select commands located within a graphical user interface containing an electronic program guide. Current systems do not allow users to record macros for remote control devices using command or functions native to graphical user interfaces. Additionally, current systems are unable to assign command sequences, regardless of the source, to any macro element (i.e., hard keys, soft keys, etc.) accessible by the system.

Therefore, what is needed is a method, system, user interface, software, and signal to allow sequences of commands, from remote controls and other sources, to be assigned to any user interface element.

SUMMARY OF THE INVENTION

Accordingly, the present invention provides a method, in a system using commands, the method comprising the steps of selecting a sequence of at least one remote control command and at least one user interface command, and assigning the sequence of commands to at least one user interface element.

The present invention further provides a convergence system comprising at least one processor, memory operably associated with the processor, at least one remote control device for selecting at least one remote control command, at least one user interface configured to input at least one user interface command, and a program of instructions. The program of instructions configured to be executed by the processor and stored in the memory, the program including instructions configured to select a sequence of at least one remote control command and at least one user interface command, and to assign the sequence of commands to at least one user interface element.

The present invention further provides a graphical user interface (GUI) comprising means for selecting a sequence of at least one remote control command and at least one user interface command, and means for assigning the sequence of commands to at least one user interface element.

The present invention further provides a computer readable medium tangibly embodying a program of instructions, the program of instructions implementing the method of selecting a sequence of at least one remote control command and at least one user interface command, and assigning the sequence of commands to at least one user interface element.

The present invention further provides a signal embodied in a propagation medium, the signal comprising at least one instruction configured to select a sequence of at least one remote control command and at least one user interface command, and at least one instruction configured to assign the sequence of commands to at least one user interface element.

It is an object of the present invention to assign macros to software and hardware macro elements regardless of the source of macros.

It is another object of the present invention to allow users to select macro commands using all user interfaces.

It is another object of the present invention to create macros automatically.

It is a further object of the present invention to monitor macro generation efficiency.

It is a further object of the present invention to monitor thresholds for macro definition.

One advantage the present invention provides to users is the capability to assign a macro containing a sequence of commands to software or hardware macro elements.

A further advantage the present invention provides to users is the ability to assign macro elements to a sequence of macro commands regardless of the macro command source.

Another advantage the present invention provides to users is the ability to automatically record a macro.

A further advantage the present invention provides to users is the ability to use macro commands to create additional macros.

A further advantage the present invention provides to users is the ability to monitor macro generation efficiency.

BRIEF DESCRIPTION OF THE DRAWINGS

Other objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures, and wherein:

DETAILED DESCRIPTION OF A PREFERRED EMBODIMENT OF THE INVENTION

In the following detailed description of the preferred embodiments, reference is made to the accompanying drawings that form a part hereof, and in which is shown by way of illustration, specific preferred embodiments in which the invention may be practiced. These embodiments are described in sufficient detail to enable those skilled in the art to practice the invention, and it is understood that other embodiments may be utilized and that logical, mechanical and/or electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

Figure 1:
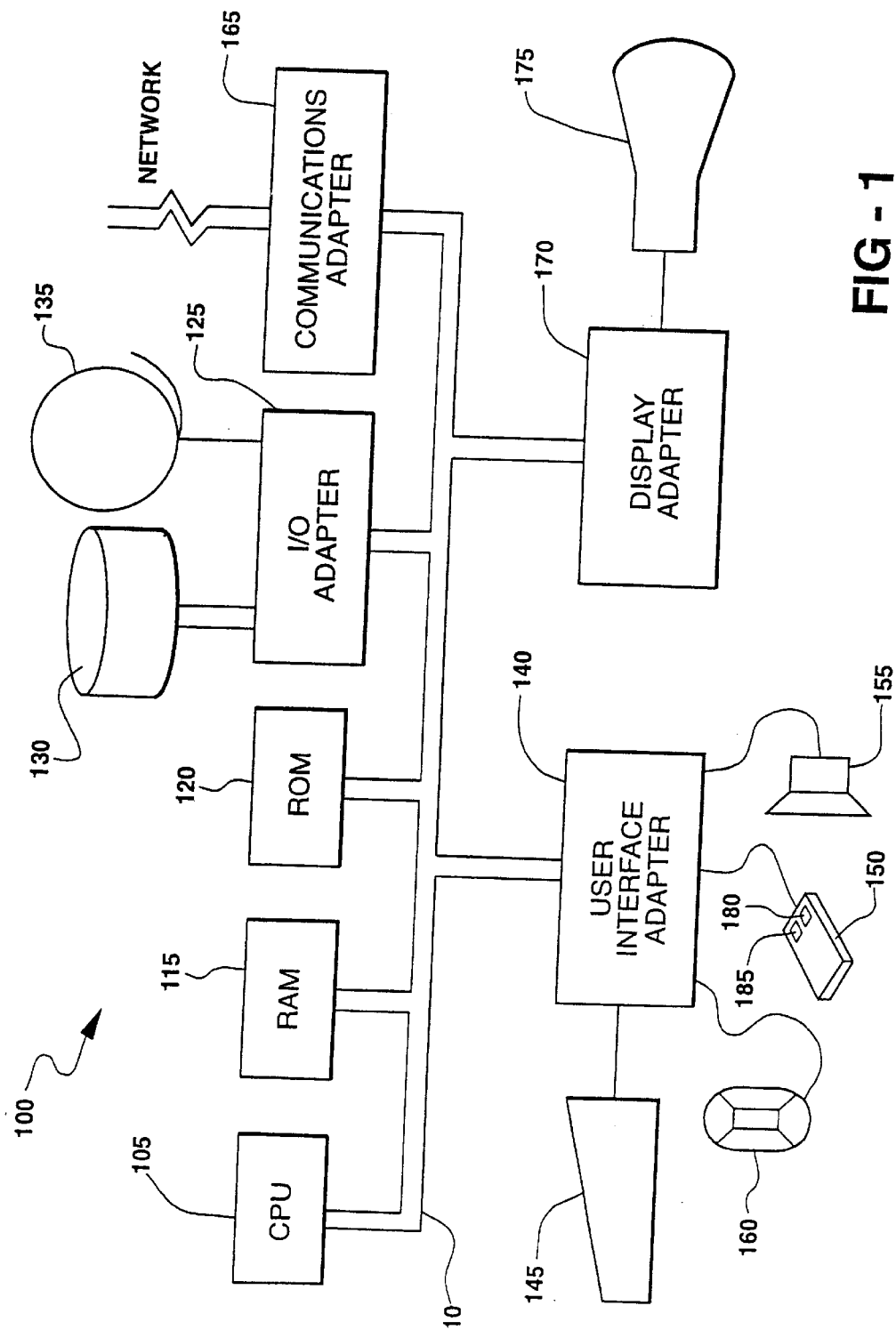
FIG. 1 illustrates a detailed block diagram showing a computer system according to a preferred embodiment of the present invention.

A representative hardware environment for practicing the present invention is depicted in FIG. 1 which illustrates a typical hardware configuration of an information handling system 100 in accordance with the present invention, having a central processing unit (CPU) 105 such as a conventional microprocessor and a number of other units interconnected via at least one system bus 110. Information handling system 100 may be, for example, a portable or desktop Gateway computer or a Gateway Destination system (Gateway and Destination are trademarks of Gateway 2000, Inc.). Information handling system 100 shown in FIG. 1 includes random access memory (RAM) 115, read-only memory (ROM) 120, an input/output (I/O) adapter 125 for connecting peripheral devices such as disk units 130 and tape drives 135 to system bus 110, a user interface adapter 140 for connecting a keyboard 145, a mouse 150, a speaker 155, a microphone 160, and/or other user interface devices to system bus 110, a communications adapter 165 for connecting information handling system 100 to an information network such as the Internet, and a display adapter 170 for connecting system bus 110 to a display device such as a monitor 175. The mouse 150 typically has a first button and a second button, 180 and 185 respectively, and is used to control a cursor (not shown) displayed on the monitor 175.

Figure 2:
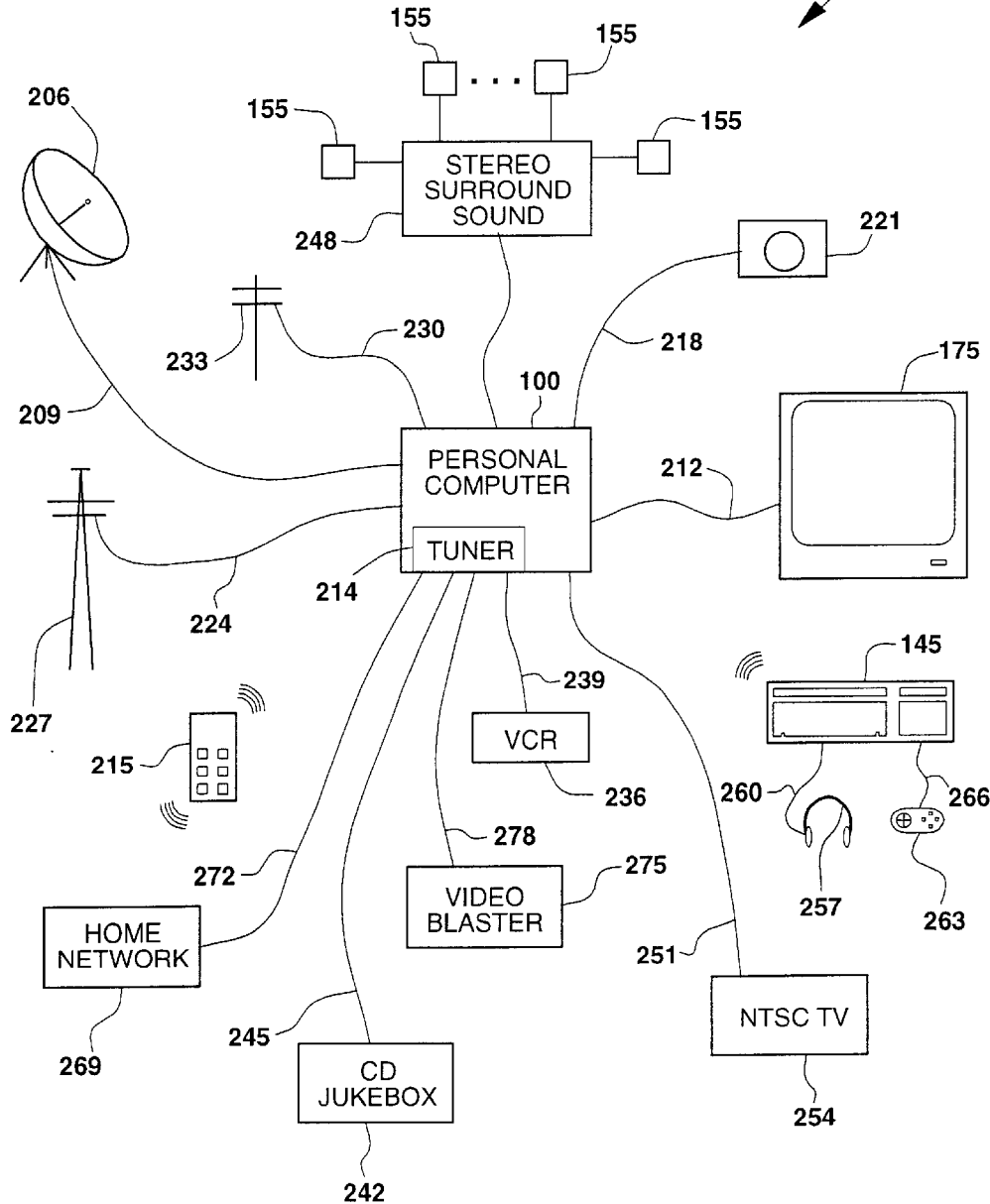
FIG. 2 illustrates a detailed block diagram showing a convergence system according to the preferred embodiment of the present invention.

Referring next to FIG.2, a home entertainment or convergence system such as the Gateway Destination System mentioned above is shown generally at 200. Reference numerals or letters in FIG. 2 which are like, similar, or identical to the reference numerals or letters of FIG. 1 indicate like, similar, or identical components or features. External to convergence system 200 is satellite 203 which in one preferred embodiment is a HS601 model operated by Hughes at a 101 degree west longitude geosynchronous orbital location and which transmits signals comprising 150 channels of modulated digital video, audio, and data at a frequency of about 12 GHz. The satellite signals are received by home entertainment system 200 through antenna 206 containing a low noise block converter amplifier. Antenna 206 is preferably about 18 inches in diameter and receives left- and right-hand circularly polarized signals between 12.2 and 12.7 GHz. Antenna 206 provides a "downconverted-spectrum" signal between 950 and 1450 MHz via a coaxial cable or other suitable communication medium 209 to information handling system 100 such as a personal computer or other system or circuitry capable of processing data. Suitable antennas 206 are already being manufactured and sold by RCA Corporation via direct sales and through numerous major retail chains such as Radio Shack.

System 100 contains circuitry and software to further process signals from the antenna, generally demodulating and decoding the signal to produce a VGA (video graphics adapter) signal. The VGA signal is provided via a standard VGA-compatible monitor cable to drive large screen data quality monitor 175 which is suitable for viewing in a family room or entertainment room environment. System 100 provides for user input by means of remote controls 215 and 145. Remote control 215 comprises a hand-held size device with standard television controls and a numeric keypad and, in one embodiment, VCR (video cassette recorder) controls and a pointing device. It provides RF (radio frequency) or IR (infrared) control signals received by system 100. Remote control 145 is a full function personal computer keyboard with additional standard television and VCR controls and a pointing device which is preferably in the form of a touchpad, and it also provides RF control signals to system 100. RF control signals were selected over IR control signals or hardwired connections in one embodiment due to its performance in a home entertainment environment. RF control allows the system to be in a different room from monitor 175, or if in the same room, a clear line of sight is not required. In another embodiment, IR control signals were selected because the standard circuitry is available at a low cost. Monitor cable 212 is a standard type cable typically used on VGA display devices and comprises up to 15 electrical conductors interfacing with monitor 175 in a D-series shell connector. In one embodiment, full multimedia sourcing and directing of audio/video/data (A/V/D) broadcast is provided for.

Information handling system 100 may include a tuner 214, tuner circuitry, or card capable of both tuning to multiple channels and receiving television information or signals in the form of the NTSC (National Television Standards Committee) or PAL (Phase Alteration Line) forms from any medium such as from a cable system or from a digital satellite system. One embodiment of the signal on cable 209 from satellite dish 206 provides digital A/V/D signals from such sources as DirecTV or Primestar (DirecTV and Primestar are trademarks of their respective companies). In another such embodiment, the signal on cable 209 provides analog A/V such as NTSC (National Television Systems Committee) antenna signals. In another such embodiment, the signal on cable 218 from camera 221 provides analog A/V such as NTSC audio/video signals. In further embodiments, the signal on cable 224 from cable-data source 227 provides analog and/or digital A/V/D. In further such embodiments, the signal on cable 230 from PSTN (Public Switched Telephone Network) 233 provides data or phone signals such as ISDN (integrated services digital network) or POTS (plain old telephone system) signals. In one set of such embodiments, system 100 is programmed to automatically record analog signals such as television programming onto recordable media such as a video tape in VCR 236 coupled to cable 239. In another such set of embodiments, system 100 is programmed to automatically record digital signals such as digital television programming or CD-ROM (Compact Disk—Read Only Memory) type audio onto recordable media such as recordable compact disks in CD/DVD jukebox 242 coupled to cable 245. CD/DVD jukebox 242 also plays CDs, CD-ROMs, or DVD-ROMs for use elsewhere. In another such embodiment, signals are sent to stereo surround sound system 248 for audio output to one or more speakers 155, and on cable 251 to TV 254. In one such embodiment, earphones 257 on cable 260 and gamepad 263 on cable 266 provide additional input/output through remote control 145. Home network 269 is "smart wiring" used to transmit data and control within the home, coupled by cable 272 to system 100. Videoblaster 275 provides video signal processing on cable/connector 278. Cables 224, 209, 230, 218, 251, 239, 278, 245, 260, and 266 are examples of communication cables that may be wired coupling or wireless, such as RF or IR.

One example of convergence system 200 is the Destination System using the DestiVu user interface manufactured and sold by Gateway 2000, Inc. In this manner, convergence system 200 is a fully functional computer integrated with a television providing TV viewing (via broadcast, cable, satellite, VCR, digital disk, or other broadcast media) and personal computing functionality. This convergence of computer and television enables a user the combined access to both television programs and information as well as computer related functionality such as computer information and programs and Internet access.

Although many of today's televisions employ much of the same hardware resources employed by computers such as information handling system 100, it is possible that the present invention might be practiced in other electronic devices or in networked electronic devices. For example, with the development of audio/video networking such as the recently proposed HAVi standard, television sets or other audio/video devices such as audio/video receivers and VCRs that do not themselves contain such resources could implement the present invention by utilizing the resources of other devices on a network.

Figure 3:
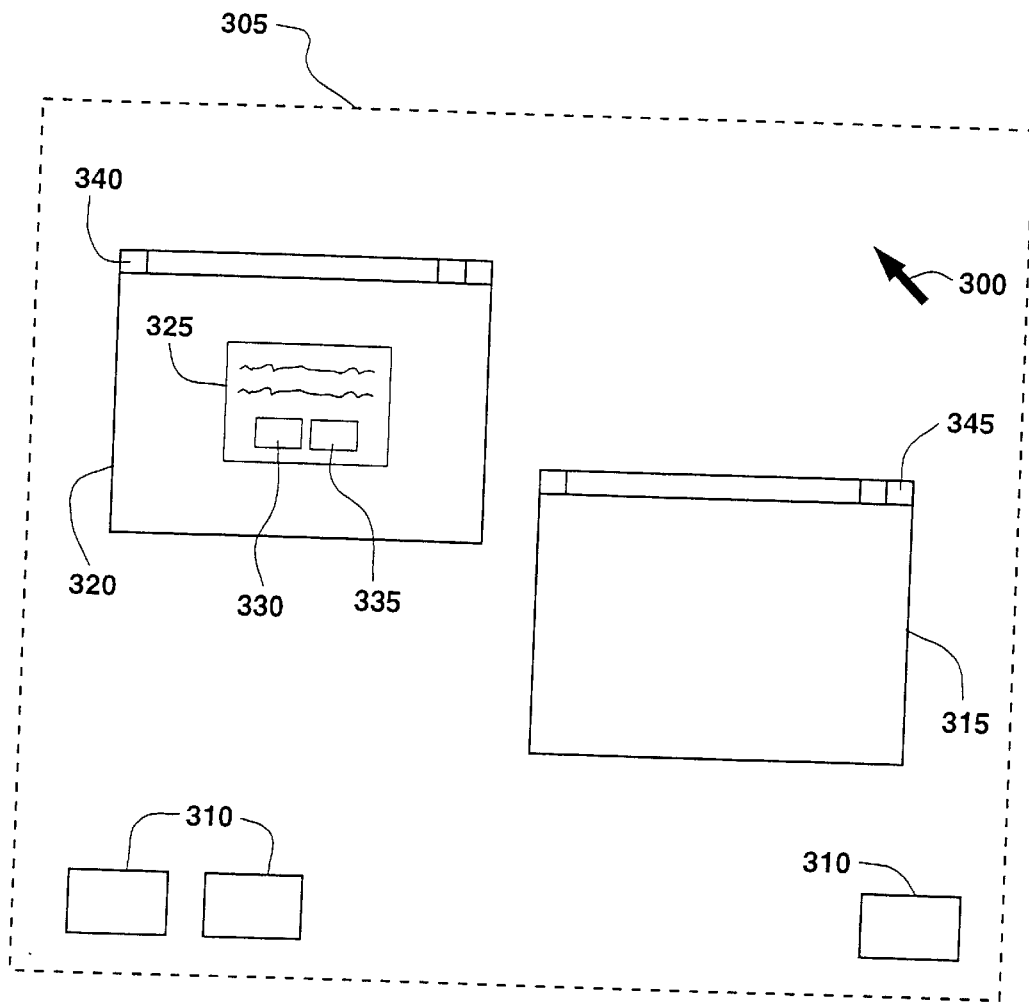
FIG. 3 shows the desktop of a computer operating system user interface typically employed on a computer system as in FIGS. 1 and 2 according to the preferred embodiment of the present invention.

Referring next to FIG. 3, a detail of an operating system's graphical user interface, or GUI, as is typically displayed on monitor 175 in accordance with the present invention is illustrated. Reference numerals or letters in FIG. 3 which are like, similar, or identical to the reference numerals or letters of FIGS. 1–2 indicate like, similar, or identical components or features. The operating system shown in FIG. 3 is IBM's OS/2 (OS/2 is a trademark of International Business Machines Corporation). However, the present invention will work with DestiVu, Windows 98, Windows 95 (DestiVu is a trademark of Gateway 2000 Inc. and Windows 98 and Windows 95 are trademarks of Microsoft Corporation), or any other graphical user interface. This GUI includes cursor 300, desktop 305, three icons 310, a first window and a second window, 315 and 320 respectively, and dialog box 325, all of which are well known in the art. Dialog box 325 further contains a first button and a second button, 330 and 335 respectively. Programs are represented by the graphical user interface as either icons 310 or windows 315 and 320. The horizontal region along the top of the first window 315 is the first title bar 340 and the along the top of the second window 320 is the second title bar 345. The program windows 315 and 320 are the "focus" when they have been designated by a user or by an operating system to receive input from the keyboard 145 or mouse 150. In OS/2®, the user gives the window focus by clicking a mouse button 180 or 185 when cursor 300 is inside that window. Some operating systems, however, give a window the focus merely whenever cursor 300 is present within that window. The operating system indicates which program has the focus by changing the color of the focused window's title bar 340 or 345.

Now that an environment to practice the present invention has been described, a further explanation of commands used within system 100/200 must be conveyed. In the preferred embodiment, commands are used to carry out specific functions defined within system 100/200. As a trivial example, the arrow keys located on keyboard 145 allow a user to move cursor 300 within a window located on desktop 305. A complex example would be to perform a search of system 100/200 for all files containing a specific textual string of characters. Some users tend to perform sequences of commands in a habitual manner, thus warranting the need to record the sequence of commands and store them in a macro, wherein macros and macro recording are well known in the art. In a preferred embodiment, a sequence of commands is recorded as a macro and macro elements are used to access the recorded sequence of commands. The macro element therefore, serves as a means by which the sequence of commands may be accessed for execution. Macro elements reside within system 100/200 as hard keys and soft keys, wherein a hard key is a hardware key located on a device such as remote control device 215, keyboard 145, or mouse 150, etc., and wherein a soft key is a software produced macro key such as a macro button, icon, name, etc. Thus, by creating macros, users eliminate having to perform the same set of rudimentary commands.

In a preferred embodiment, a macro contains commands initiated by a remote control device such as remote 215 and commands initiated by any user interface within system 100/200 (i.e., remote control functions, keyboard functions, mouse functions, graphical, user interface command functions, etc.). Further, the macro element for accessing the recorded macro may be any of the above mentioned macro elements (i.e., hard keys, soft keys, icons, names, etc.). For example, a user can define a macro element on remote control device 215 to perform the functions of launching a web browser, selecting a domain within the web browser, launching an Electronic Program Guide displaying a list of all currently airing PG rated programs, and turning on CD Jukebox 242 and selecting an assortment of jazz tracks to be played randomly. Upon a user recording a macro and assigning a macro element to the recorded macro, each of these commands would be performed when the user depresses the macro key on remote control device 215.

In another embodiment of the present invention, system 100/200 may be configured to allow access to Home Network 269, thus allowing a user to further reduce rudimentary tasks. For example, the present invention would allow a user to create a macro to perform several tasks such as tasks performed when first arriving home. These tasks may include turning on selected lights within the home, turning on the TV with the volume being muted, launching a web browser, checking e-mail, and playing back all newly received voice-mail messages. Therefore, the present invention enables a user to perform any sequence of commands, regardless of the source of the commands, with the single activation of any macro element available to system 100/200. The following figures further describe the details in implementing the present invention.

Figure 4:
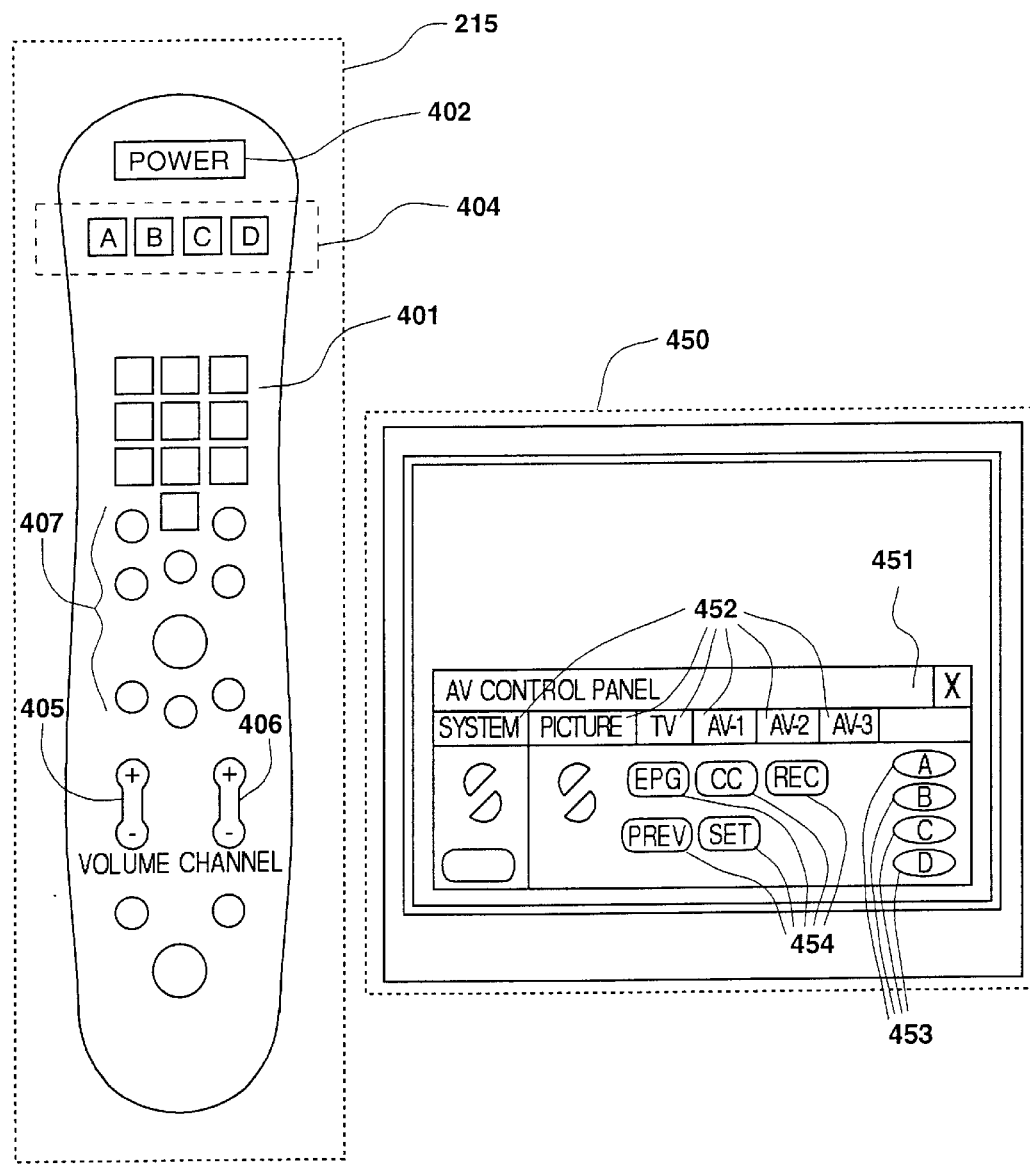
FIG. 4 is an illustration of a remote control device and graphical user interface according to the preferred embodiment of the present invention.

Referring now to FIG. 4, an illustration of a remote control device and a graphical user interface according to the preferred embodiment is shown, wherein reference numerals or letters in FIG. 4 which are like, similar, or identical to the reference numerals or letters in FIGS. 1–3 indicate like, similar, or identical components or features. Remote control device 215 is typically an infrared (IR) communications device used to communicate with system 100/200. Remote control device 215 traditionally would be used as an interface between a television, VCR, stereo, etc., facilitating access to a plurality of commands by depressing any combination of buttons or keys on remote control device 215. In a preferred embodiment, remote control device 215 allows the user access to all components contained within convergence system 100/200, to perform commands forthcoming of all components within the system (i.e., TV, VCR, PC, stereo, etc.). Remote control device 215 contains buttons such as a numbered keypad 401, a power key 402, a volume control key 405, a channel selection key 406, and additional keys 407, to access the plurality of components within system 100/200. In a preferred embodiment, remote control device 215 contains macro keys 404 used to access macros that have been recorded using system 100/200.

Also illustrated in FIG. 4, is a graphical user interface 450 containing a control panel 451 with source buttons 452, function buttons 454, and a series of macro elements depicted by macro buttons 453. Macro buttons 453 are used to access macros stored within system 100/200 wherein, as mentioned above, the recorded macro may be generated from any combination of input command sources.

Figure 5:
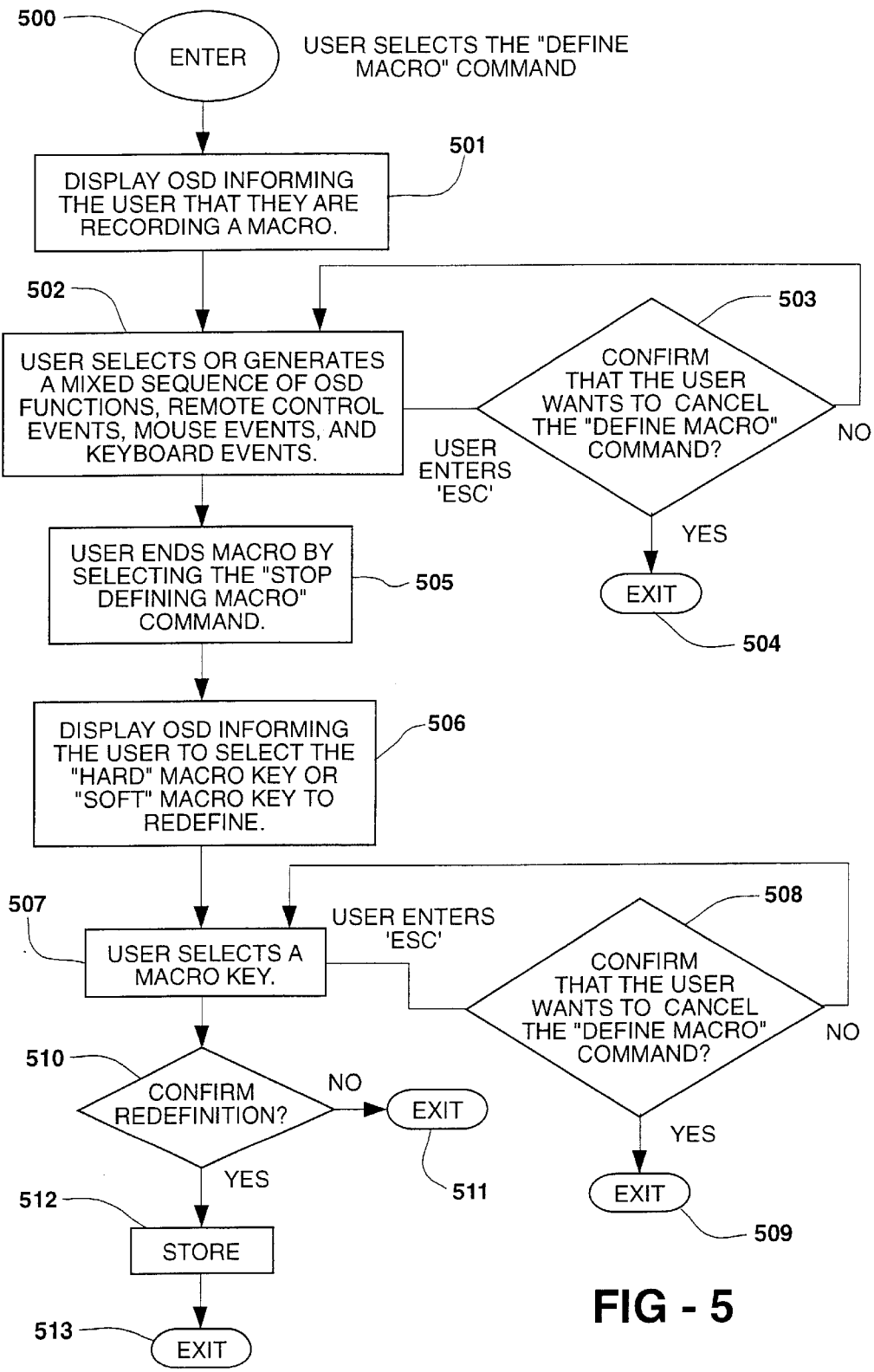
FIG. 5 is an illustration of a method according to a preferred embodiment of the present invention.

Referring next to FIG. 5, an illustration of a method according to a preferred embodiment is shown, wherein reference numerals or letters in FIG. 5 which are like, similar, or identical to the reference numerals or letters in FIGS. 1–4 indicate like, similar, or identical components or features. The method begins at Step 500 when a user elects to define a macro. The method then proceeds to Step 501 where an on-screen display is displayed by display device 175 informing the user that a macro is being recorded. The method then proceeds to Step 502 where the user selects or generates a mixed sequence of on-screen display functions, remote control event functions, mouse event functions, and/or keyboard event functions, as the commands to be recorded. In a preferred embodiment of the present invention, a time delay may also be considered as a macro command. For example, if a user inputs a sequence of commands and one of the commands requires establishing communications between devices, a time delay may be recorded as part of the sequence of commands. One such example would be a computer "synching-up" with a peripheral device before recording further commands to be performed in association with the peripheral device. Commands and recording commands as macros are well established in the art.

In a preferred embodiment of the present invention, at any point if the user depresses the escape key located on keyboard 145, the method proceeds to Step 503 where the macro recording is halted and a message is displayed asking the user if they would like to cancel the "Define Macro" command. If the user elects to cancel the "Define Macro" command, the method proceeds to exit at Step 504. However, if the user elects to continue recording the macro, the method returns to Step 502 where the sequence of commands are input to system 100/200.

The method then proceeds to Step 505 where the user selects the "Stop Defining" macro command and subsequently to Step 506 where an on-screen display prompts the user to select a type of macro element. Macro elements include interface elements such as hard macro keys 404 on remote control device 215 or soft macro keys such as macro buttons 453 on GUI 450. The method then proceeds to Step 507 where the user selects the desired macro key to be defined. Conversely, at Step 507 the user may depress the escape key on keyboard 145 to be prompted with an option to cancel the "Define Macro" command at Step 508 and further exit the method at Step 509. At Step 507, upon the user selecting a macro key, the method proceeds to Step 510 where the user is prompted to confirm the redefinition of the selected macro key selected in Step 507. If the user denies confirmation of defining the macro key, the method proceeds to Step 511 where the method exits. Conversely, if the user confirms defining the macro key, the method proceeds to Step 512 where the sequence of commands are stored as a macro and a macro element is defined in association with the stored macro. The method then proceeds to step 513 where it exits.

Figure 6:
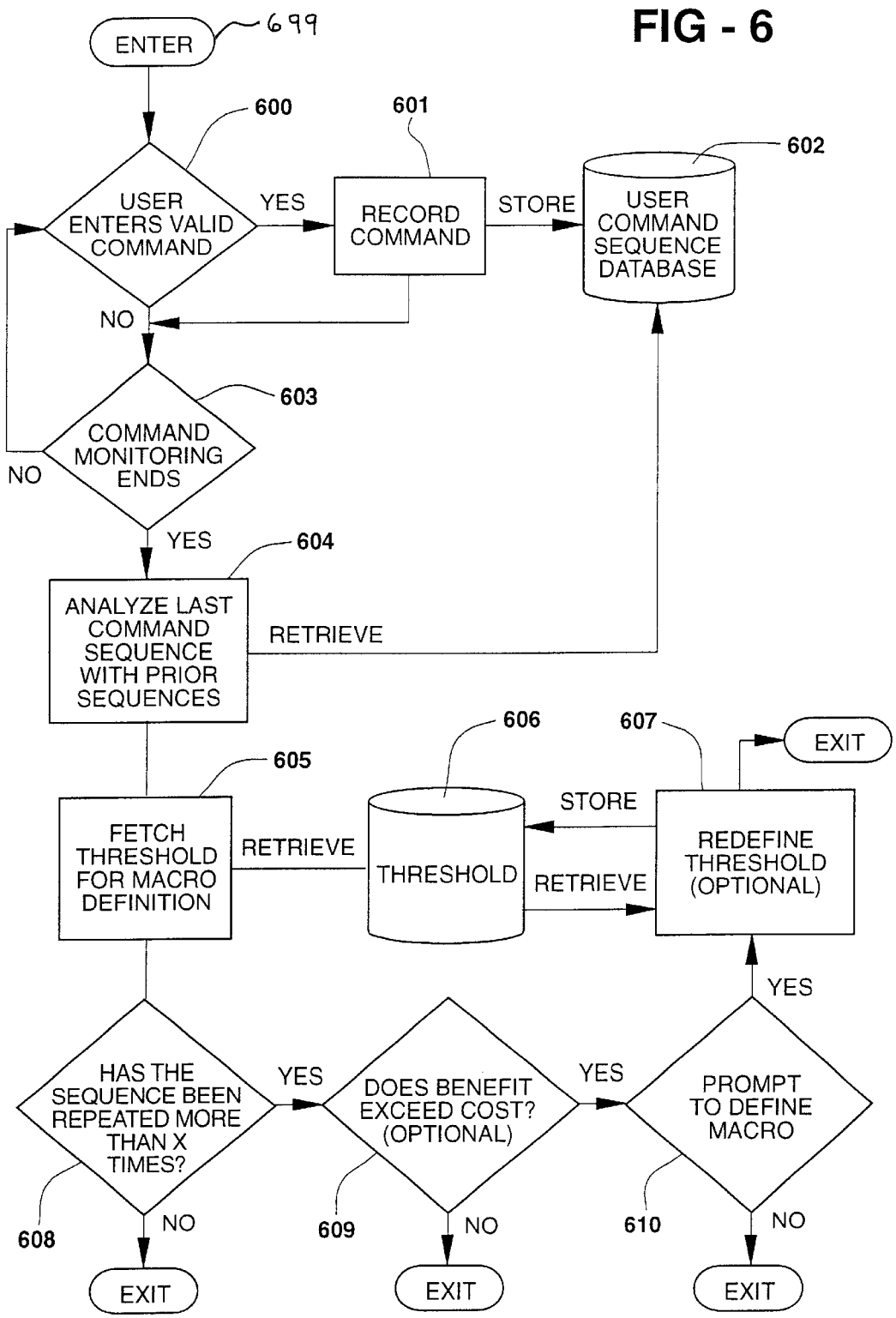
FIG. 6 is an illustration of an alternative method according to a preferred embodiment of the present invention.

Referring now to FIG. 6, an illustration of an alternative method according to a preferred embodiment is shown, wherein reference numerals or letters in FIG. 6 which are like, similar, or identical to the reference numerals or letters in FIGS. 1–5 indicate like, similar, or identical components or features. The method shown in FIG. 6 is an alternate embodiment of the present invention where a sequence of commands inputted into system 100/200 is automatically detected by system 100/200, and the user is prompted to define a macro and assign a macro element (i.e., hard key, soft key, macro button, etc.) to the detected sequence of commands. The method is performed by a user entering valid commands from any command source utilized within system 100/200. The sequence of commands are monitored by the system and compared to a user command sequence database for uniqueness. Said another way, the sequence of commands is compared to all the other sequence of commands that exist within system 100/200 and, upon identifying a unique sequence of commands, the user will be prompted to define a macro for the new sequence of commands. This is accomplished by having the process retrieve a threshold for macro definition, where the threshold is the number of times the unique sequence of commands must be input to system 100/200 before being able to be defined by the system. In other words, the threshold serves as the minimal number of times that the sequence of commands must be input to system 100/200 before the user is prompted to define a macro. In another embodiment of the above-described method, the threshold may be redefined upon new macros being added. For example, if a macro is added for a command sequence that was repeated six times and the previous threshold was five, the threshold would be increased to six. In another embodiment, the method would also perform a cost-benefit analysis to determine the efficiency of the sequence of commands prior to recording the sequence of commands. For example, if a sequence of commands was going to require a user to depress three macro keys in addition to the macro key that the user would be defining, the complexity of the macro would not be great enough to warrant assigning a macro and macro element to the sequence of commands. All in all, upon the method identifying a command sequence to be recorded, the user is prompted to define the macro and assign the macro to a macro element.

FIG. 6 further illustrates the details for implementing the above described embodiments of the present invention. The process flow begins at 699 at Enter. In Step 600, a command is inputted into system 100/200 and validated. If a valid command is entered, the method proceeds to step 601 where the command is recorded and stored in User Command Sequence Database 602. The method then proceeds to step 603 to identify when command monitoring ends. Accordingly at step 600, if the user inputs an invalid command the method proceeds to the Command Monitoring Ends step 603. Command Monitoring continues until the user invokes an appropriate event such as terminating a command-centric user interface. Command monitoring would also be terminated if a command is not input to system 100/200 for an elapsed period of time. Upon terminating Command Monitoring, the method proceeds to step 604 where the input sequence is retrieved from User Command Sequence Database 602 and compared with previously recorded input command sequences. If the input command sequence is identified, a counter associated with the identified command sequence is incremented. The method then proceeds to step 605 where a threshold 606 for macro definition (i.e., repeated three times, etc.) is retrieved. The method then proceeds to step 608 where it determines if the command sequence has been repeated more than the threshold obtained in step 605. If the threshold has not been exceeded, the method exits at step 608. However, if the command sequence has been repeated more than the threshold, the method proceeds to step 609 where an optional cost-benefit analysis is performed. The cost-benefit analysis involves determining if the complexity of the sequence of commands warrants assigning a macro. If a macro definition is not warranted, the method proceeds to exit at step 609. If it is determined that the user would benefit by defining a macro for the command sequence, the method proceeds to step 610 where the user is prompted to define a macro for the detected sequence of commands. The method ends at step 610 after defining the macro or, in another embodiment, proceeds to optional blocks 607 where the threshold level is redefined. For example, if the user repeated the sequence of commands six times before defining a macro for the detected sequence, the method would compare the current threshold level obtained from 606 to the number of times the sequence was repeated. The method would then adjust the threshold to a new value and store the threshold value in Threshold database 606. The method would then exit accordingly.

In one embodiment of the present invention, system 100/200 contains a command processor to process commands inputted from different sources, where a command processor is a system program that accepts user commands and converts them into machine commands required by the operating system, control program, or application. In another embodiment, additional sources for commands and macros may be realized without departing from the true spirit of the invention. One such embodiment, for example, would include processing speech commands to activate macros wherein the system would contain an interactive voice program capable of converting speech patterns into a format to be used by the system for accessing macro commands. The program would first digitize the speech pattern and match the pattern against a dictionary of coded waveforms. Within the dictionary would be a list of recorded macro commands to be used by the present invention. For example, a user could record a macro defined by the speech pattern "I'm Home" wherein the macro would perform the previously mentioned commands of turning on selected lights in the home, turning on the TV, playing back newly recorded voice mail messages, etc.

In conclusion, the present invention provides a signal, software, graphical user interface, system, and method to select a sequence of commands from a remote control input device and to further select additional commands from other user interfaces such as a graphical user interface, keyboard, mouse, etc., to be recorded and assigned to any user interface element available to the system. User interface elements may be assigned from any input source available to the system such as graphical user interface elements like macro buttons, icons, names, etc., or other elements such as keys on remote control devices, Keyboards, etc. In one embodiment of the present invention, a user may be asked to specify a macro element prior to recording the macro. The present invention also monitors the sequence of remote control and user interface commands and identifies a sequence of commands. Further, the sequence of commands are compared to a predetermined acceptance criteria, such as uniqueness, threshold, and/or efficiency, and upon meeting or exceeding the criteria, the user is prompted to assign the sequence of commands to a user interface element (i.e., hard key, soft key, icons, buttons, etc.).

Although an embodiment of the present invention has been shown and described in detail herein along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

Although the invention has been described with a certain degree of particularity, it should be recognized that elements thereof may be altered by persons skilled in the art without departing from the spirit and scope of the invention. One of the preferred implementations of the invention is as sets of instructions resident in the random access memory 115 of one or more computer or information handling systems configured generally as described in FIGS. 1–6. Until required by the computer system, the set of instructions may be stored in another computer readable memory, for example, in a hard disk drive or in a removable memory such as an optical disk for eventual use in a CD-ROM drive or a floppy disk for eventual use in a floppy disk drive. Further, the set of instructions can be stored in the memory of another computer or encoded or embodied in a signal, such as an analog or digital signal, embodied in a propagation medium and transmitted over the propagation medium by a user. The propagation medium may include a local area network or a wide area network, such as the Internet, or other propagation medium. One skilled in the art would appreciate that the physical storage or encoding of the sets of instructions physically changes the medium upon which it is stored or encoded electrically, magnetically, or chemically so that the medium carries computer readable instructions and other information. The invention is limited only by the following claims and their equivalents.

What is claimed is:

1. A method in a convergence system using commands, said method comprising:
    selecting, from a plurality of user interfaces active within the system, a sequence of at least one command associated with a remote control input device for carrying out a preselected remote control function defined within the system and at least one command associated with a user interface input device within the system other than a remote control input device for carrying out a preselected user interface control function defined within the system; and
    assigning the sequence of commands to a user interface element.

2. The method, as recited in claim 1, wherein the user interface element is a graphical user interface element.

3. The method, as recited in claim 1, wherein the user interface element is an input device element.

4. The method, as recited in claim 1, wherein the user interface command is a graphical user interface command.

5. The method, as recited in claim 1, wherein said selecting step includes selecting the commands from an input source.

6. The method, as recited in claim 1, further comprising monitoring the selection of the sequence of remote device control and user interface commands.

7. The method, as recited in claim 6, further comprising identifying the sequence of commands from said monitoring step which meets or exceeds a predetermined acceptance criteria.

8. The method, as recited in claim 1, wherein said assigning step includes prompting a user to assign the sequence of commands to the at least one user interface element if the sequence of commands meets or exceeds a predetermined acceptance criteria.

9. The method according to claim 1, wherein the at least one command associated with a remote control input device originates from the remote control input device, and the at least one command associated with a user interface input device originates from the user interface input device.

10. The method according to claim 1, wherein the user interface input device is a general purpose programmable computer having a RAM, a user input device, and a graphical user interface.

11. The method according to claim 10, wherein the user interface control function is a user input command associated with the user input device for controlling the graphical user interface.

12. The method according to claim 11, wherein the user input device is a keyboard, a keypad, or a mouse.

13. The method according to claim 10, wherein the user interface control function is a search of the computer for information.

14. The method according to claim 10, wherein the user interface control function is a source selector or a function selector.

15. The method according to claim 1, wherein the command associated with the user interface input device comprises a plurality of commands.

16. The method according to claim 1, wherein the user interface input device is a general purpose programmable computer having a RAM, a user input device, and a graphical user interface, the user interface control function being a user input command associated with the user input device for controlling the graphical user interface, and the user input device being a keyboard, a keypad, or a mouse.

17. A convergence system comprising:
    at least one processor;
    memory operably associated with said processor;
    a plurality of user interfaces active within the system, including:
        at least one remote control device for carrying out a preselected remote control function defined within the system; and
        at least one user interface other than a remote control input device, the at least one user interface being configured to carry out a preselected user interface control function defined within the system;
    a program of instructions configured to be executed by said processor and stored in said memory, said program including instructions configured to:
        select a sequence of at least one command associated with the remote control input device and at least one command associated with the user interface input device; and
        assign the sequence of commands to a user interface element.

18. The system, as recited in claim 17, wherein the user interface element is a graphical user interface element.

19. The system, as recited in claim 17, wherein the user interface element is an input device element.

20. The system, as recited in claim 17, wherein the user interface command is a graphical user interface command.

21. The system, as recited in claim 17, wherein said select includes selecting the commands form an input source.

22. The system, as recited in claim 17, further comprises monitoring the selection of the sequence of remote device control and user interface commands.

23. The system, as recited in claim 22, further comprises identify the sequence of commands from a aid monitor which meets or exceeds a predetermined acceptance criteria.

24. The system, as recited in claim 17, wherein said assigning includes prompting a user to assign the sequence of commands to the at least one user interface element if the sequence of commands meets or exceeds a predetermined acceptance criteria.

25. The convergence system according to claim 17, wherein the at least one command associated with the remote control input device originates from the remote control input device, and the at least one command associated with the user interface input device originates from the user interface input device.

26. A graphical user interface (GUT) comprising:
    means for selecting, from a plurality of user interfaces active within a convergence system, a sequence of at least one command associated with a remote control input device for carrying out a preselected remote control function defined within the system and at least one command associated with a user interface input device within the system other than a remote control input device for carrying out a preselected user interface control function defined within the system; and means for assigning the sequence of commands to a user interface element.

27. The GUI, as recited in claim 25, wherein the user interface element is an input device element.

28. The graphical user interface (GUI) according to claim 26, wherein the at least one command associated with a remote control input device originates from the remote control input device, and the at least one command associated with a user interface input device originates from the user interface input device.

29. A computer readable medium tangibly embodying a program of instructions, the program of instructions implementing the method of:

selecting, from a plurality of user interfaces active within a convergence system, a sequence of at least one command associated with a remote control input device for carrying out a preselected remote control function defined within the system and at least one command associated with a user interface input device within the system other than a remote control input device for carrying out a preselected user interface control function defined within the system; and assigning the sequence of commands to a user interface element.

30. The computer readable medium, as recited in claim 29, wherein the user interface element is a graphical user interface element.

31. The computer readable medium, as recited in claim 29, wherein the user interface element is an input deice element is an input device element.

32. The computer readable medium, as recited in claim 29, further comprising monitoring the selection of the sequence of remove device control and user interface commands.

33. The computer readable medium, as recited in claim 32, further comprising identifying the sequence of commands from the monitoring step which meets or exceeds a predetermined acceptance criteria.

34. The computer readable medium, as recited in claim 29, wherein the assigning step includes prompting a user to assign the sequence of commands to the at least one user interface element if the sequence of commands meets or exceeds a predetermined acceptance criteria.

35. The computer readable medium according to claim 29, wherein the at least one command associated with a remote control input device originates from the remote control input device, and the at least one command associated with a user interface input device originates from the user interface input device.

36. A signal embodied in a propagation medium, said signal comprising:

at least one instruction configured to select, from a plurality of user interfaces active within a convergence system, a sequence of at least one command associated with a remote control input device for carrying out a preselected remote control function defined within the system and at least one command associated with a user interface input device within the system other than a remote control input device for carrying out a preselected user interface control function defined within the system; and at least one instruction configured to assign the sequence of commands to a user interface element.

37. The signal, as recited in claim 36, wherein the user interface element is a graphical user interface element.

38. The signal, as recited in claim 36, wherein the user interface element is an input device element.

39. The signal embodied in a propagation medium according to claim 38, wherein the at least one command associated with a remote control input device originates from the remote control input device, and the at least one command associated with a user interface input device originates from the user interface input device.

* * * * *